United States Patent
Kajiyama et al.

(10) Patent No.: US 11,121,686 B2
(45) Date of Patent: Sep. 14, 2021

(54) AMPLIFIER CIRCUIT

(71) Applicant: Hitachi, Ltd., Tokyo (JP)

(72) Inventors: Shinya Kajiyama, Tokyo (JP); Tadahiro Nabeta, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/828,550

(22) Filed: Mar. 24, 2020

(65) Prior Publication Data

US 2020/0382085 A1 Dec. 3, 2020

(30) Foreign Application Priority Data

May 30, 2019 (JP) .............................. JP2019-101027

(51) Int. Cl.
*H03F 3/45* (2006.01)
*H03F 1/52* (2006.01)

(52) U.S. Cl.
CPC ............. *H03F 3/4508* (2013.01); *H03F 1/52* (2013.01); *H03F 2200/444* (2013.01); *H03F 2203/45314* (2013.01)

(58) Field of Classification Search
CPC .................................................. H03F 3/4508
See application file for complete search history.

(56) References Cited

U.S. PATENT DOCUMENTS

| | | | | |
|---|---|---|---|---|
| 3,210,562 A * | 10/1965 | Yoshizawa | ............... | H03K 5/13 327/205 |
| 3,483,517 A * | 12/1969 | Gange | .................... | G11C 11/44 365/129 |
| 4,999,519 A * | 3/1991 | Kitsukawa | ......... | H03K 19/0016 326/110 |
| 5,365,120 A * | 11/1994 | Main | ..................... | H03K 5/003 327/165 |
| 7,348,847 B2 * | 3/2008 | Whittaker | ............ | H03F 1/0211 330/250 |
| 2014/0104000 A1 * | 4/2014 | Gerstenhaber | ...... | H03F 3/45174 330/257 |
| 2017/0359060 A1 * | 12/2017 | Godycki | ............... | H03K 17/74 |

FOREIGN PATENT DOCUMENTS

JP      5-235709 A      9/1993

* cited by examiner

*Primary Examiner* — Patricia T Nguyen
(74) *Attorney, Agent, or Firm* — Crowell & Moring LLP

(57) ABSTRACT

An amplifier circuit includes a potential relation between a common emitter amplifier circuit (amplifier circuit body) including an NPN transistor (bipolar transistor) and a clamp circuit which maintains a potential relation between a base-collector of the NPN transistor of the common emitter amplifier circuit. The clamp circuit includes a level shift circuit and a clamp diode for suppressing a decrease in the collector potential of the NPN transistor of the common emitter amplifier circuit.

8 Claims, 15 Drawing Sheets

AMPLIFIER CIRCUIT

BACKGROUND OF THE INVENTION

1. Field of the Invention

The present invention relates to an amplifier circuit.

2. Description of the Related Art

In recent years, a sensing system that obtains external information from a sensor and performs signal processing has been applied to a wider range of applications. For example, for automatic driving of an automobile, the sensing system that performs signal processing on various types of information such as distance measurement information obtained by radar, Light Detection and Ranging (LIDAR), and acceleration information and angle information obtained by an inertial sensor is used. Further, a medical image diagnostic apparatus such as an ultrasonic diagnostic apparatus uses the sensing system that processes a signal from a transducer that performs acoustic/electric conversion. The sensing system includes an amplifier circuit for amplifying a signal received from the sensor.

As an example of the amplifier circuit, JP 5-235709 A discloses a Schmitt circuit capable of obtaining complementary outputs and arbitrarily setting threshold voltages in positive and negative directions.

SUMMARY OF THE INVENTION

In a case where an overload is input from the sensor, the potential relation between the base and the collector of a bipolar transistor is reversed in the amplifier circuit, and the amplifier circuit comes to be in a saturation state. As a result, the amplifier circuit cannot temporarily output a potential corresponding to an input signal, and an idle period in which the output signal has disappeared occurs.

Therefore, an object of the invention is to provide an amplifier circuit that can suppress saturation of the amplifier circuit and reduce an idle period of signal disappearance even in a case where an overload is input.

The outline of typical aspects of the invention disclosed in the present application will be briefly described as follows.

An amplifier circuit according to a representative embodiment of the invention includes an amplifier circuit body including a bipolar transistor, and a clamp circuit that maintains a potential relation between a base and a collector of the bipolar transistor of the amplifier circuit body. The clamp circuit includes a level shift circuit and a clamp diode that suppresses a decrease in a collector potential of the bipolar transistor of the amplifier circuit body.

The effects obtained by typical aspects of the invention disclosed in the present application will be briefly described as follows.

In other words, according to the representative embodiment of the invention, even when an overload is input, it is possible to suppress the saturation of an amplifier circuit and reduce the idle period in which the signal disappears.

DESCRIPTION OF THE PREFERRED EMBODIMENTS

[Supplement to Assignment]

Figure 12:
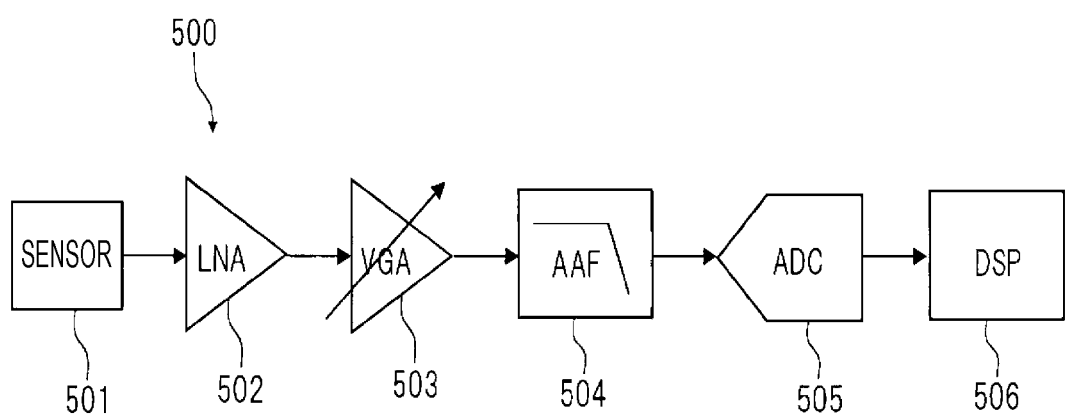
FIG. 12 is a block diagram illustrating a configuration example of a sensing system.

Herein, a supplementary explanation will be given on the above-mentioned problem. FIG. 12 is a block diagram illustrating a configuration example of a sensing system. As illustrated in FIG. 12, a sensing system 500 includes a sensor 501, a Low Noise Amplifier (LNA) 502, a Variable Gain Amplifier (VGA) 503, an Anti-Alias Filter (AAF) 504, an Analog to Digital Converter (ADC) 505, and a Digital Signal Processor (DSP) 506.

In the sensing system 500, a physical quantity to be sensed is converted into an analog electric signal by the sensor 501, and the electric signal is amplified by the LNA 502. After the amplified electric signal is further amplified by the VGA 503, the analog signal is converted to a digital signal by the ADC 505.

At that time, in order to reduce noise aliasing due to discrete-time sampling in analog/digital conversion, the AAF 504 attenuates unnecessary radio-frequency noises outside a predetermined band included in the amplified electric signal, and then performs analog/digital conversion.

The digital signal output from the ADC 505 is subjected to signal processing by the DSP 506.

When an overload is output from the sensor 501, the receiving circuits such as the LNA 502 and the VGA 503 shift to a saturation operation beyond a linear range. After the transition to the saturation state, it takes time for an amplifier circuit to return to the normal operation.

Figure 13:
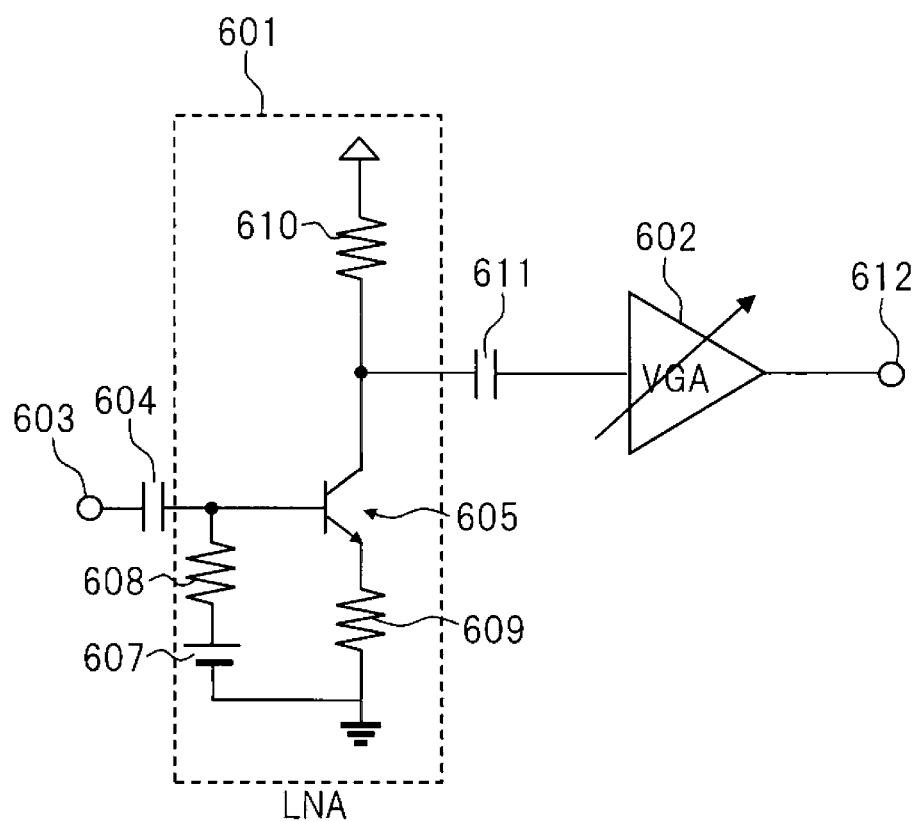
FIG. 13 is a diagram illustrating a configuration example of a front end in a conventional sensing system.

FIG. 13 is a diagram illustrating a configuration example of a front end in a conventional sensing system. More specifically, FIG. 13 illustrates a configuration in which a general LNA and VGA are combined.

An input terminal 603 is connected to the base of an NPN transistor 605 via a capacitor 604. The base of the NPN transistor 605 is grounded via a resistor 608 and a DC voltage source 607. The base potential of the NPN transistor 605 is determined by a bias circuit including the resistor 608 and the DC voltage source 607.

The gain of the LNA 601 is determined by the transconductance of the NPN transistor 605, the resistance value of an emitter degeneration resistor 609, and the resistance value of a collector load resistor 610.

Figure 14:
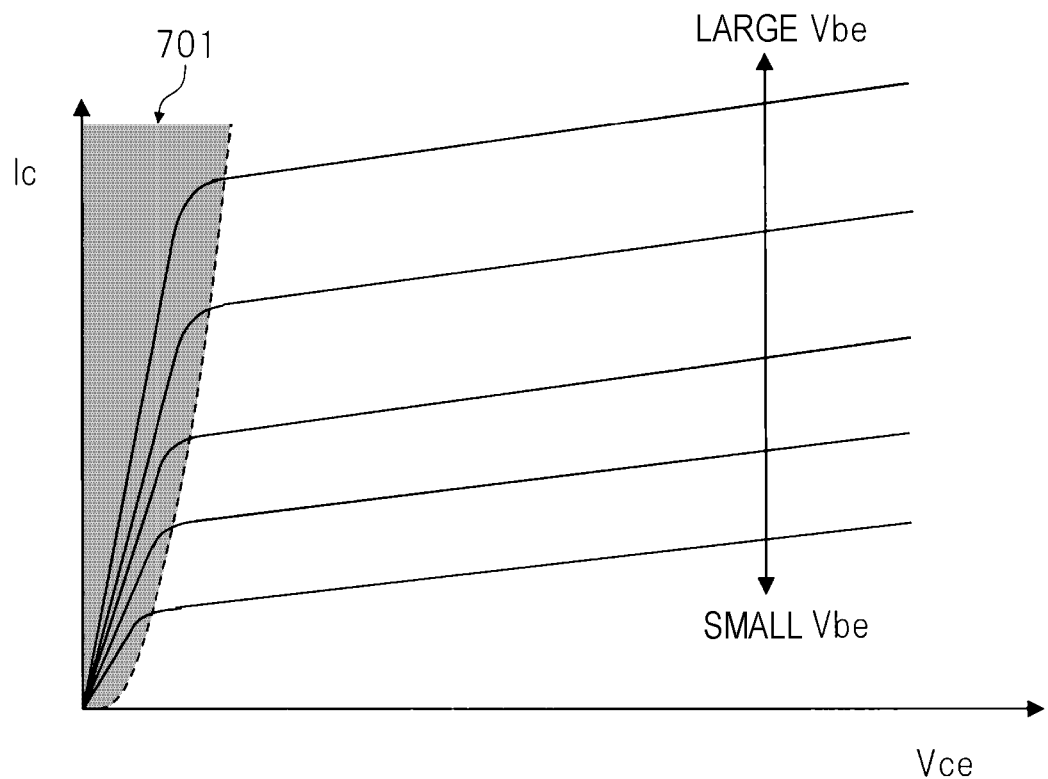
FIG. 14 is a diagram illustrating a collector current of a transistor and a static characteristic between a collector-emitter potential.
Figure 15:
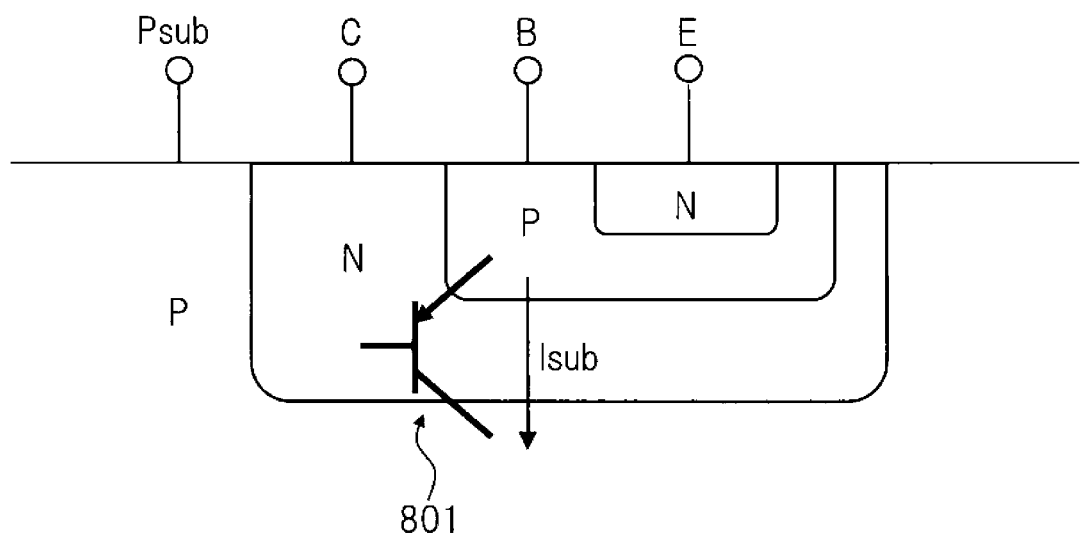
FIG. 15 is a cross-sectional view illustrating a transistor and a parasitic transistor.

FIG. 14 is a diagram illustrating static characteristics between a collector current Ic and a collector-emitter potential Vce of the transistor. FIG. 15 is a cross-sectional view illustrating a transistor and a parasitic transistor.

When an overload is input to the input terminal 603, the base potential of the NPN transistor 605 increases, and a collector potential decreases. Then, the operation of the NPN transistor 605 shifts to a saturation region 701 illustrated in FIG. 14. In the saturation region 701, the base-collector of the NPN transistor is forward-biased, so that a desired gain is not able to be obtained. Therefore, the NPN transistor is usually designed so as not to enter the saturation region 701.

Once in the saturation region 701, the problem of the parasitic transistor illustrated in FIG. 15 also occurs. In a case where a silicon substrate is a P-type, a parasitic PNP transistor 801 also exists in the NPN transistor. In a case where the collector potential of the NPN transistor 605 is higher than the base potential, the parasitic PNP transistor 801 does not turn on because base potential>emitter potential. On the other hand, when an overload is input to the input terminal 603 and the NPN transistor 605 satisfies the state of collector potential<base potential, the parasitic PNP transistor 801 satisfies the state of base potential <emitter potential, the parasitic PNP transistor 801 turns on. The base current of the transistor 605 is drawn to the P-type substrate as a substrate current Isub.

Figure 16:
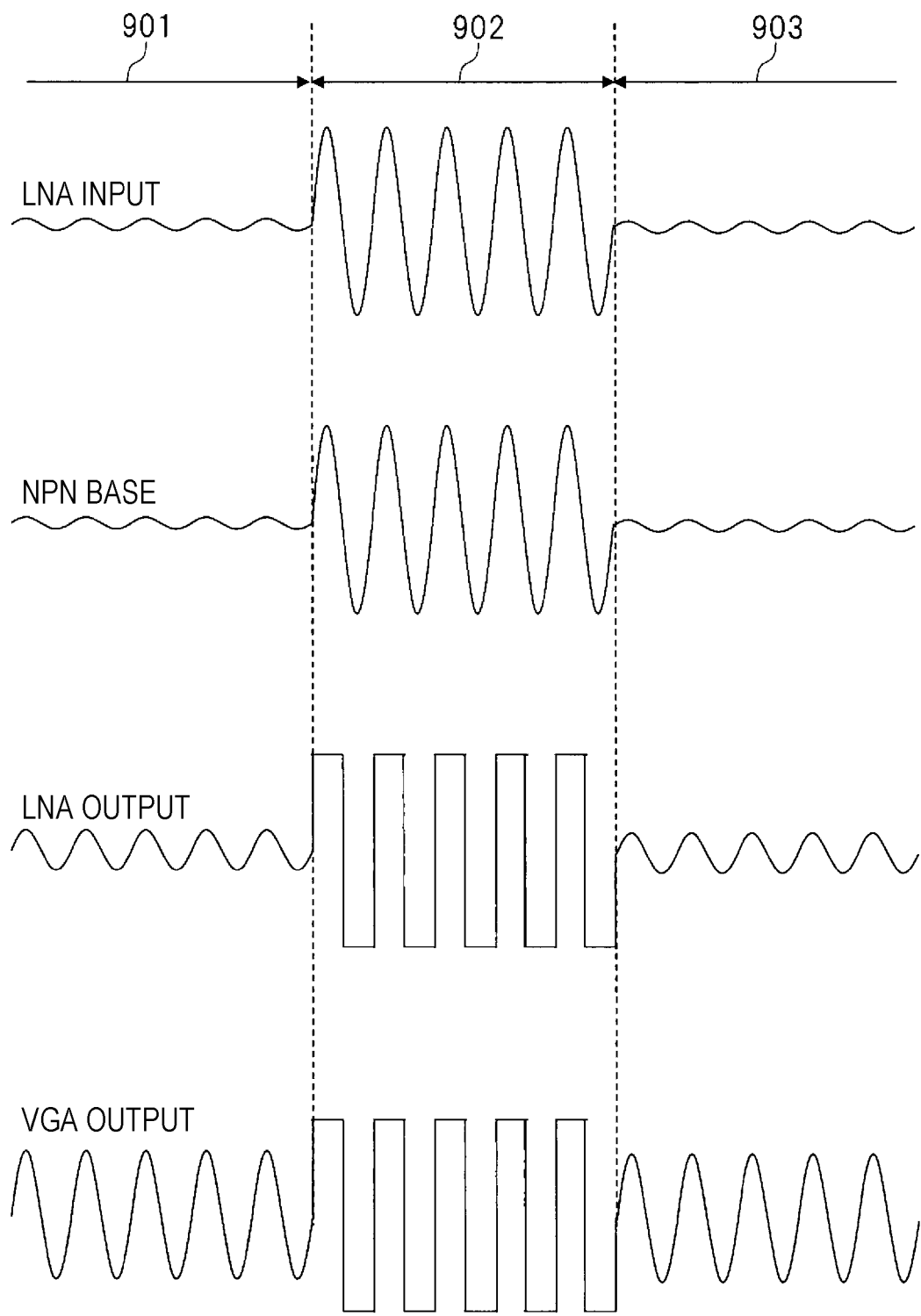
FIG. 16 is a timing chart illustrating an example of an operation before and after an overload input.
Figure 17:
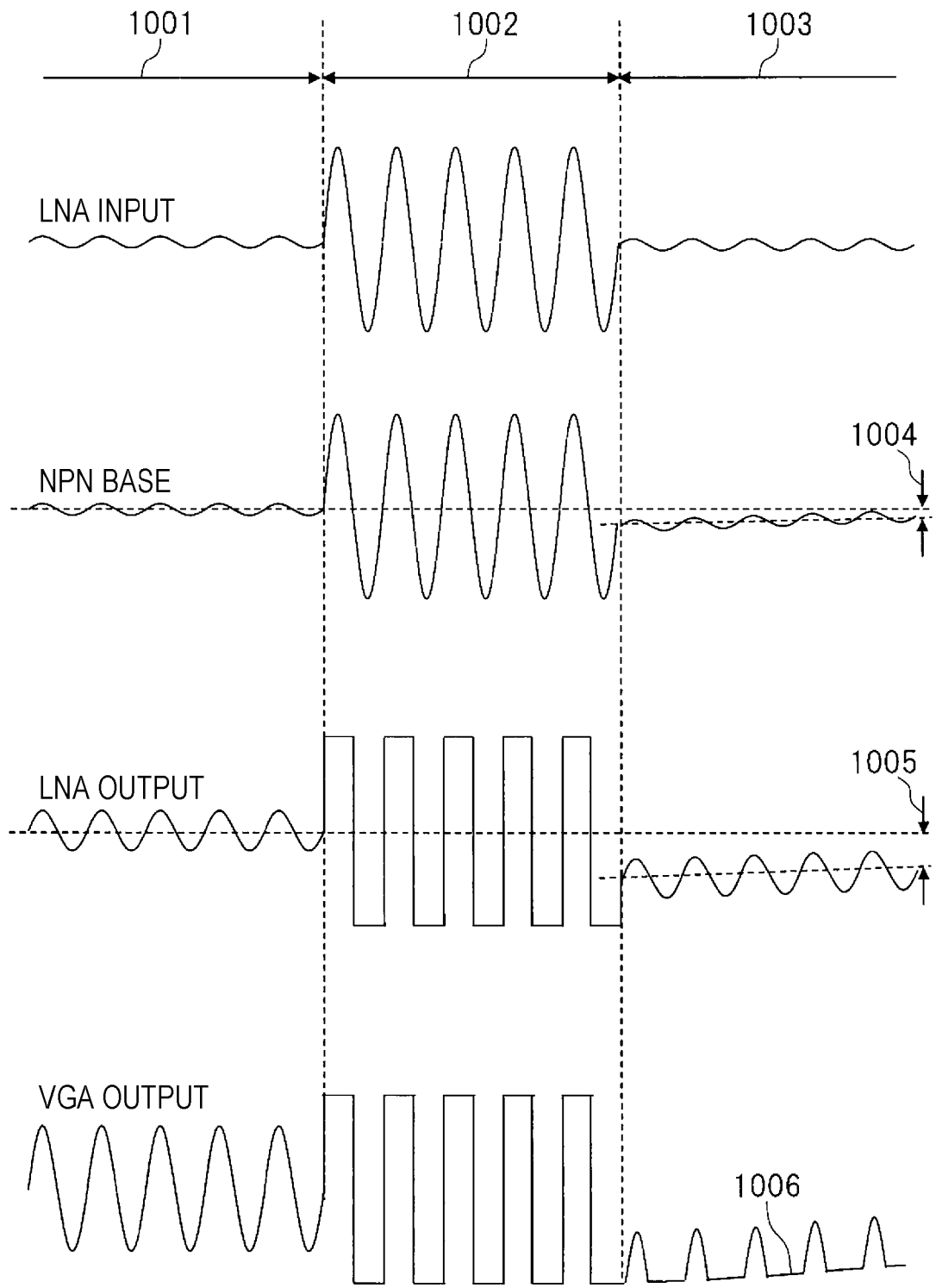
FIG. 17 is a timing chart illustrating an example of an operation before and after an overload input.

The operation at this time will be described with reference to a timing chart. FIGS. 16 and 17 are timing charts illustrating an example of the operation before and after overload input. FIG. 16 is a timing chart when the parasitic PNP transistor does not turn on even when an overload is input. After a normal signal period 901, an overload is input to the input terminal 603 of the LNA 601 in an overload burst period 902. Thereafter, the process returns to a normal signal period 903.

As illustrated in FIG. 16, in the overload burst period 902, a signal distorted like a rectangular wave exceeding the linear range is output, but after the overload burst period 902, the normal signal is output again. A similar signal is output from the subsequent VGA.

On the other hand, FIG. 17 is a timing chart when the parasitic PNP transistor is turned on when an overload is input. The LNA input is the same as in FIG. 16. When the transition from a normal signal period 1001 to an overload burst period 1002 occurs, the parasitic PNP transistor 801 of the NPN transistor 605 turns on, and a part of the base current is drawn to the P-type substrate as the substrate current Isub.

As a result, an offset 1004 illustrated in FIG. 17 occurs in the base potential of the NPN transistor 605. The offset is amplified by the LNA gain, and an output offset 1005 also occurs in the LNA output. After the end of the overload burst period 1002, since a signal including an offset is input to the VGA 602, the VGA 602 is in a saturation state exceeding the linear range. As a result, the output signal becomes a signal indicated by 1006, and the VGA 602 cannot linearly amplify and output the input signal.

The offset 1004 of the LNA 601 is gradually eliminated, and the LNA 601 moves to the normal operation before the overload burst period 1002. However, the time constant related to the offset decay is determined by the capacitance value of the capacitor 604 of a capacitively-coupled bypass filter of the LNA input and the resistance value of the resistor 608. As it is designed to be reduced much, it takes time to eliminate the input offset. During this period, the signal of LNA+VGA disappears, so that the sensing system cannot operate normally and becomes an idle period.

In order to avoid such problems of the saturation of the NPN transistor and the parasitic PNP transistor, a method of clamping the collector potential of the transistor 605 of the LNA 601 so as not to drop below a predetermined potential can be considered. JP 5-235709 A proposes a method of clamping the collector potential by a diode.

Figure 3:
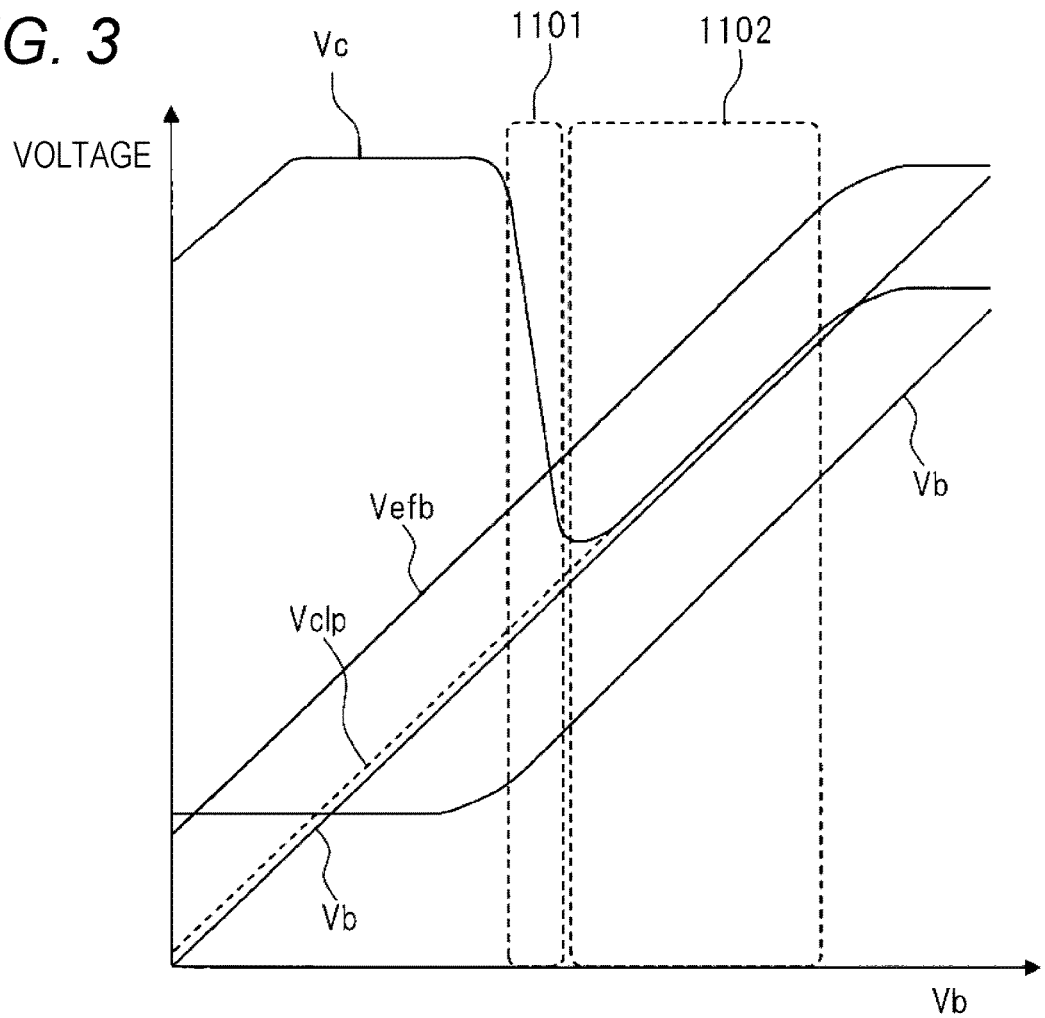
FIG. 3 is a diagram illustrating an example of DC characteristics of the amplifier circuit according to the second embodiment of the invention.
Figure 18:
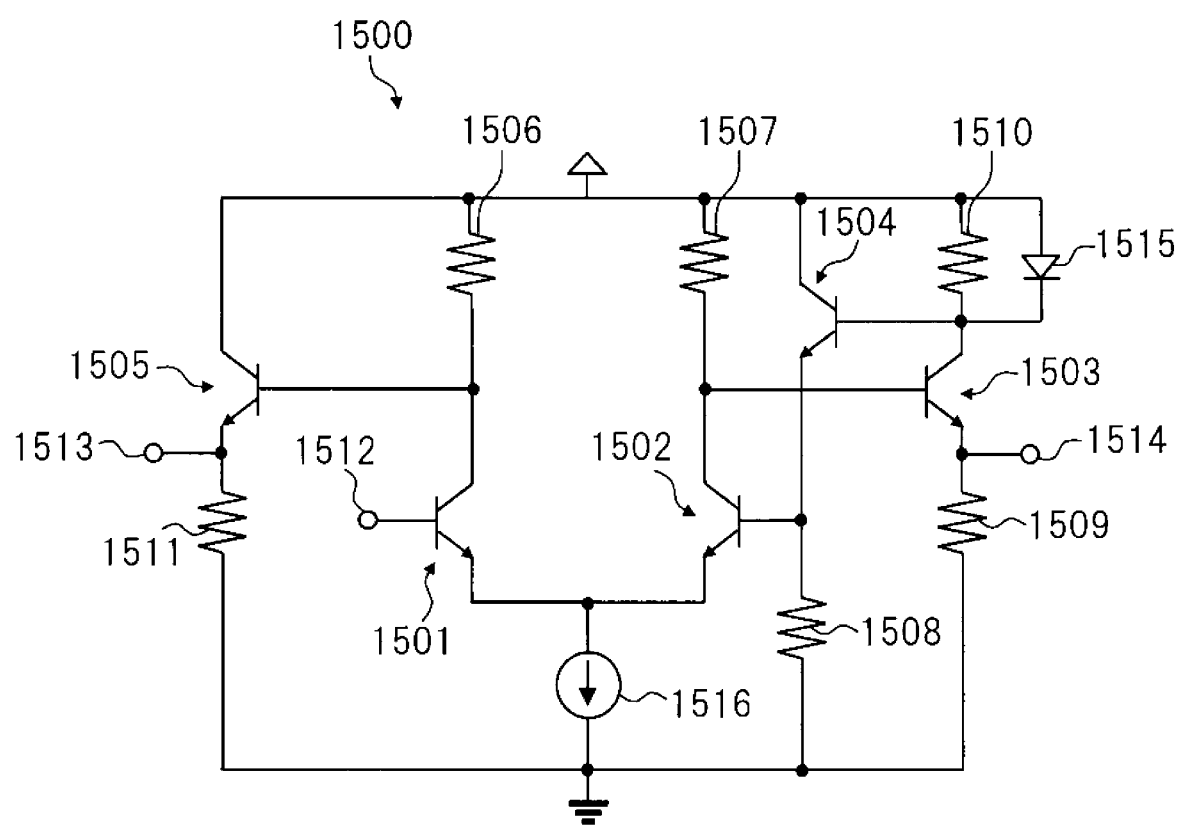
FIG. 18 is a diagram redrawn from FIG. 3 of JP 5-235709 A from the viewpoint of the inventor.

FIG. 18 is a diagram redrawn from FIG. 3 of JP 5-235709 A from the viewpoint of the inventor. In JP 5-235709 A, it is possible to obtain a complementary output in the Schmitt circuit and, at the same time, set a threshold voltage in the positive and negative directions arbitrarily. FIG. 18 illustrates a Schmitt circuit 1500 in which a hysteresis width can be set arbitrarily. Although the Schmitt circuit 1500 is not a circuit for linearly amplifying a signal, if it is considered that an NPN transistor 1503, an emitter degeneration resistor 1509, and a collector load resistor 1510 form a common emitter amplifier circuit, it can be considered that the collector load resistor 1510 and the clamp diode 1515 are connected in parallel to prevent the collector potential of the NPN transistor 1503 from excessively dropping into a saturation state.

In a case where the Schmitt circuit 1500 is used as a circuit that directly receives an overload from the sensor, an NPN transistor 1501 forming a differential pair in FIG. 18 may also enter the saturation region. Even if a clamp diode is added in parallel to a collector load resistor 1506 of the NPN transistor 1501 that forms the differential pair, if the potential of an input terminal 1512 rises, the NPN transistor 1501 will eventually enter the saturation state, and the above-mentioned parasitic PNP transistor may be turned on.

From such a point, there is a demand for a clamping method that does not cause the bipolar transistor to enter the saturation region with respect to an overload from the sensor.

Hereinafter, embodiments of the invention will be described with reference to the drawings. Each embodiment described below is an example for realizing the invention, and does not limit the technical scope of the invention.

In the embodiments, members having the same functions are denoted by the same symbols, and a repeated description thereof will be omitted unless particularly necessary.

First Embodiment

<Configuration of Amplifier Circuit>

Figure 1:
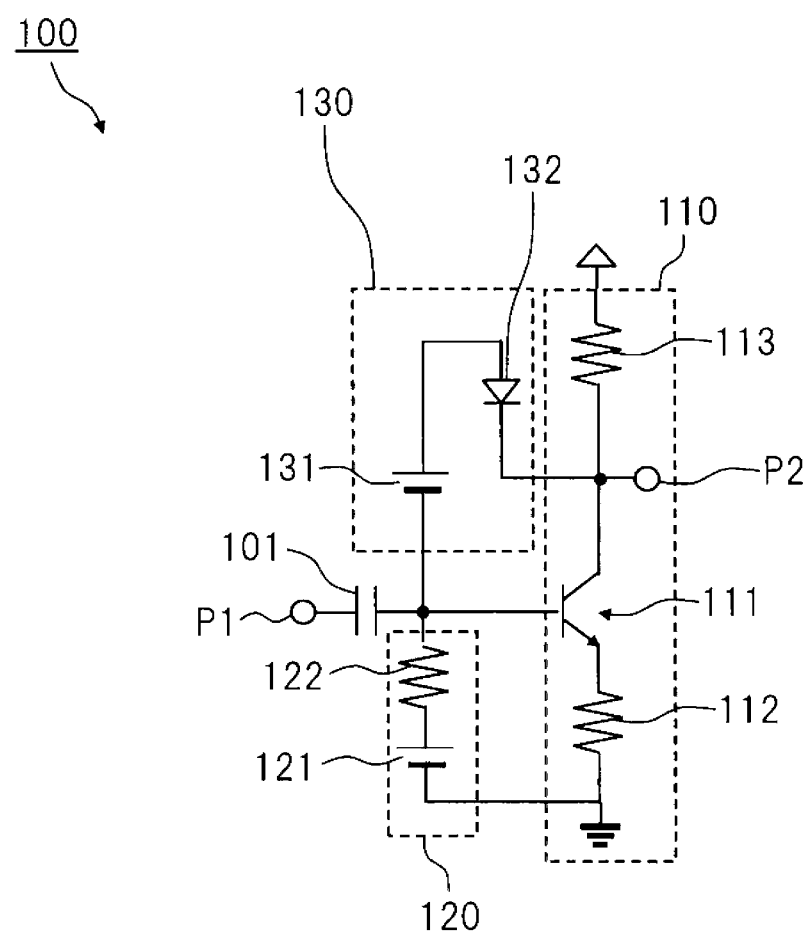
FIG. 1 is a circuit diagram illustrating an example of an amplifier circuit according to a first embodiment of the invention.

FIG. 1 is a circuit diagram illustrating an example of an amplifier circuit according to a first embodiment of the invention. An amplifier circuit 100 in FIG. 1 is a circuit corresponding to the LNA in FIG. 12. The amplifier circuit 100 of FIG. 1 includes a common emitter amplifier circuit (amplifier circuit body) 110, a bias circuit 120, a clamp circuit 130, and the like.

<<Common Emitter Amplifier Circuit>>

The common emitter amplifier circuit 110 includes an NPN transistor (bipolar transistor) 111, an emitter degeneration resistor 112, and a collector load resistor 113. The emitter of the NPN transistor 111 is grounded via an emitter degeneration resistor 112 to ground, which is a low voltage power source. The collector of the NPN transistor 111 is connected to a high potential power source via the collector load resistor 113. The collector of the NPN transistor 111 is connected to an output terminal P2. A capacitor 101 is provided between the base of the NPN transistor 111 and an input terminal P1.

<<Bias Circuit>>

The bias circuit 120 that biases the base of the NPN transistor 111 is provided between the base of the NPN transistor 111 and the emitter (or ground). The bias circuit 120 includes a constant voltage source circuit 121 and a high resistor 122. The positive side of the constant voltage source circuit 121 is connected to one end of the resistor 122. The negative side of the constant voltage source circuit 121 is grounded, and the other end of the resistor 122 is connected to the base of the NPN transistor 111. In this way, the constant voltage source circuit 121 and the resistor 122 are connected in series.

The base of the NPN transistor 111 is AC-connected to the input terminal P1 via the capacitor 101. Therefore, the bias circuit 120 can set the bias of the base of the NPN transistor 111 independently of the sensor at the preceding stage.

<<Clamp Circuit>>

The clamp circuit 130 is provided between the base and the collector of the NPN transistor 111 to maintain the potential relation between the base and the collector of the NPN transistor 111. The clamp circuit 130 includes a level shift circuit 131 and a clamp diode 132 for suppressing the collector potential of the NPN transistor 111 from falling below a predetermined potential. When the collector potential decreases, the NPN transistor 111 is in a state contrary to this potential relation. However, the clamp diode 132 bypasses the current flowing through a load resistor 113 and suppresses the decrease in the collector potential to maintain the potential relation.

The positive side of the level shift circuit 131 is connected to the anode of the clamp diode 132. The negative side of the level shift circuit 131 is connected to the base of the NPN transistor 111, and the cathode of the clamp diode 132 is connected to the collector of the NPN transistor 111. Thus, the level shift circuit 131 and the clamp diode 132 are connected in series.

The clamp circuit 130 is a circuit that clamps the collector potential of the NPN transistor 111 so that the potential of the output terminal P2 (that is, the collector potential of the NPN transistor 111) does not decrease and the NPN transistor 111 does not enter a saturation state. Specifically, the clamp diode 132 clamps the collector potential so that the collector potential does not fall below a predetermined clamp potential Vclp higher than the base potential even if the collector potential of the NPN transistor 111 decreases.

The clamp potential Vclp is a potential obtained by subtracting the forward potential of the clamp diode 132 from the inter-terminal voltage of the level shift circuit 131 with respect to the base potential of the NPN transistor 111.

<Operation of Amplifier Circuit>

Next, the operation of the amplifier circuit will be described. The input terminal P1 is connected to, for example, the sensor of FIG. 12. The signal input from the sensor includes not only a signal containing sensing data to be detected, but also environmental noise around the sensor. The overload means a signal having a high intensity among these signals.

As described above, the base of the NPN transistor 111 is AC-connected to the input terminal P1 via the capacitor 101. For this reason, the base potential of the NPN transistor 111 fluctuates according to the intensity of the input signal. In addition, the collector potential of the NPN transistor 111 also fluctuates according to the base potential of the NPN transistor 111. The clamp circuit 130 does not lower the collector potential Vc of the NPN transistor 111 to the clamp potential Vclp or lower even if a collector potential Vc drops. With this configuration, in the NPN transistor 111, the state where the collector potential Vc is higher than the base potential Vb (Vc>Vb) is maintained.

Main Effects of this Embodiment

According to this embodiment, even when an overload is input from the sensor, the state where the collector potential of the NPN transistor 111 is higher than the base potential is maintained. Accordingly, since the saturation of the amplifier circuit 100 is suppressed, the amplifier circuit 100 can return to the normal operation immediately after the end of the input of the overload, and the idle period of the signal disappearance can be reduced.

Further, the parasitic transistor is maintained in the off state, and the extraction of the base current is suppressed. With this configuration, it is suppressed that an offset occurs in the base of the NPN transistor 111 of the amplifier circuit 100 and the P2 output potential.

In addition, according to this embodiment, the clamp diode 132 is provided. With this configuration, a decrease in the collector potential of the NPN transistor 111 is suppressed, and the potential relation between the base and the collector is maintained.

Second Embodiment

Figure 2:
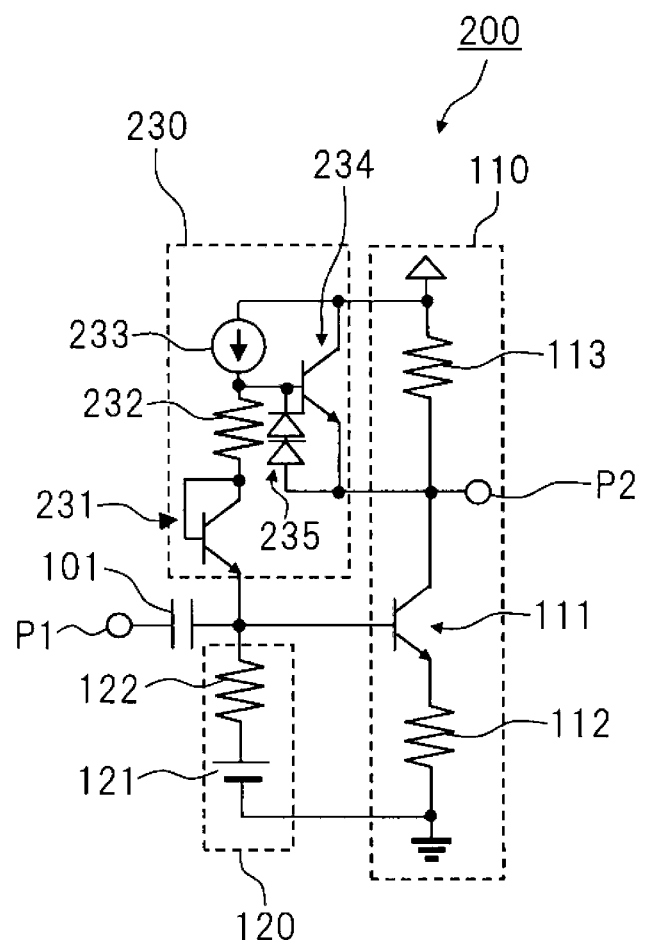
FIG. 2 is a circuit diagram illustrating an example of an amplifier circuit according to a second embodiment of the invention.

Next, a second embodiment will be described. Further, in the following, the redundant description of parts overlapping with the above-described embodiment will be omitted in principle. FIG. 2 is a circuit diagram illustrating an example of the amplifier circuit according to the second embodiment of the invention. An amplifier circuit 200 of FIG. 2 includes the common emitter amplifier circuit 110, the bias circuit 120, a clamp circuit 230, and the like.

<<Clamp Circuit>>

The clamp circuit 230 of this embodiment includes a diode 231, a resistor 232, a constant current source 233, an NPN transistor 234 of an emitter follower, and a diode 235. The diode 231 illustrated in FIG. 2 has a configuration in which the base and the collector of the NPN transistor are connected. The emitter of the NPN transistor of the diode 231 is connected to the base of the NPN transistor 111 of the common emitter amplifier circuit 110. The base and collector of the NPN transistor of the diode 231 are connected to one end of the resistor 232. The base and the collector of the NPN transistor correspond to the anode of the diode 231, and the emitter of the NPN transistor corresponds to the cathode of the diode 231.

The other end of the resistor 232 is connected to the low potential side of the constant current source 233 and the base of the NPN transistor 234. The high potential side of the constant current source 233 is connected to a high potential power source. The constant current source 233 supplies a current to the resistor 232 and the base of the NPN transistor 234 during the clamp operation. In this embodiment, the diode 231, the resistor 232, and the constant current source 233 implement the level shift circuit 131 illustrated in FIG. 1.

The collector of the NPN transistor 234 is connected to a high potential power source. The emitter of the NPN transistor 234 is connected to the collector of the NPN transistor 111 and the output terminal P2.

The NPN transistor 234 of the emitter follower clamps the collector potential (output potential of the output terminal P2) of the NPN transistor 111 of the common emitter amplifier circuit 110. In other words, in this embodiment, the clamp diode 132 of FIG. 1 is realized by the NPN transistor 234 of the emitter follower.

The diode 235 is provided between the emitter and the base of the NPN transistor 234 to prevent the voltage between the emitter and the base from exceeding a predetermined withstand voltage. The diode 235 has a configuration in which a plurality of diodes 235a and 235b are connected in series. Further, the diode 235 may be configured with one diode, or may be configured with three or more diodes. The number of diodes is appropriately selected according to a required potential difference between the emitter and the base.

The anode of the diode 235a is connected to the emitter of the NPN transistor 234. The cathode of the diode 235a is connected to the anode of the diode 235b. The cathode of the diode 235b is connected to the base of the NPN transistor 234.

The diode 235 is a clamp diode which reduces the reverse voltage between the emitter and the base of the NPN transistor 234 to a predetermined withstand voltage or less in a case where the potential of the input terminal P1 and the base potential of the NPN transistor 111 decrease and the potential of the output terminal P2 increases. With this configuration, the diode 235 protects the NPN transistor 234 and the clamp circuit 230.

Specifically, when the potential of the input terminal P1 and the base potential of the NPN transistor 111 decrease, the voltage applied to both ends of the diode 235 increases on the emitter side of the NPN transistor 234. Then, a forward current flows through the diode 235 from the emitter of the NPN transistor 234 to the base. With this configuration, the emitter potential of the NPN transistor 234 is extracted via the diode 235, and the reverse voltage between the emitter and the base of the NPN transistor 234 is adjusted to be a predetermined withstand voltage or less. In this way, the diode 235 clamps the emitter-base potential of the NPN transistor 234.

<Operation of Amplifier Circuit>

FIG. 3 is a diagram illustrating an example of DC characteristics of the amplifier circuit according to the second embodiment of the invention. In FIG. 3, Vc is the collector potential of the NPN transistor 111 of the common emitter amplifier circuit 110, Vb is the base potential of the NPN transistor 111, and Ve is the emitter potential of the NPN transistor 111. Vefb in FIG. 3 is the base potential of the NPN transistor 234 which is an emitter follower of the clamp circuit 230. Vclp is a virtual clamp potential.

Vefb becomes a potential shifted from the base potential of the NPN transistor 111 by a potential obtained by adding the base-emitter potential Vbe of an NPN transistor 231 as a diode, and the potential calculated by the product of the resistance value of the resistor 232 and the current value supplied from the constant current source 233. In other words, Vefb is higher than base potential Vb by these potentials.

Then, the clamp potential Vclp becomes a potential lower than Vefb by the base-emitter potential of the NPN transistor 234. Therefore, with the clamp circuit 230, the collector potential Vc of the NPN transistor 111 does not drop below the clamp potential Vclp.

During the normal operation, the NPN transistor 111 operates in a linear range 1101. In the linear range 1101, when the base potential Vb of the NPN transistor 111 increases, the collector potential Vc of the NPN transistor 111 decreases. Conventionally, since no clamp circuit was provided, the parasitic PNP transistor was turned on when Vc<Vb.

However, in this embodiment, the clamp potential Vclp also rises as Vb rises, and the collector potential Vc is clamped when approaching the clamp potential Vclp, and rises so as to escape from Vb. As a result, the state of Vc>Vb is maintained over a wide range including the linear range 1101 and a high base range 1102 in which the base potential Vb is higher than the linear range 1101.

In other words, even in a case where an overload is input, it prevents the parasitic PNP transistor from turning on, prevents the occurrence of offset at the input terminal P1, and thus the saturation of the subsequent VGA, and enables the normal operation immediately after the end of the overload.

Figure 4:
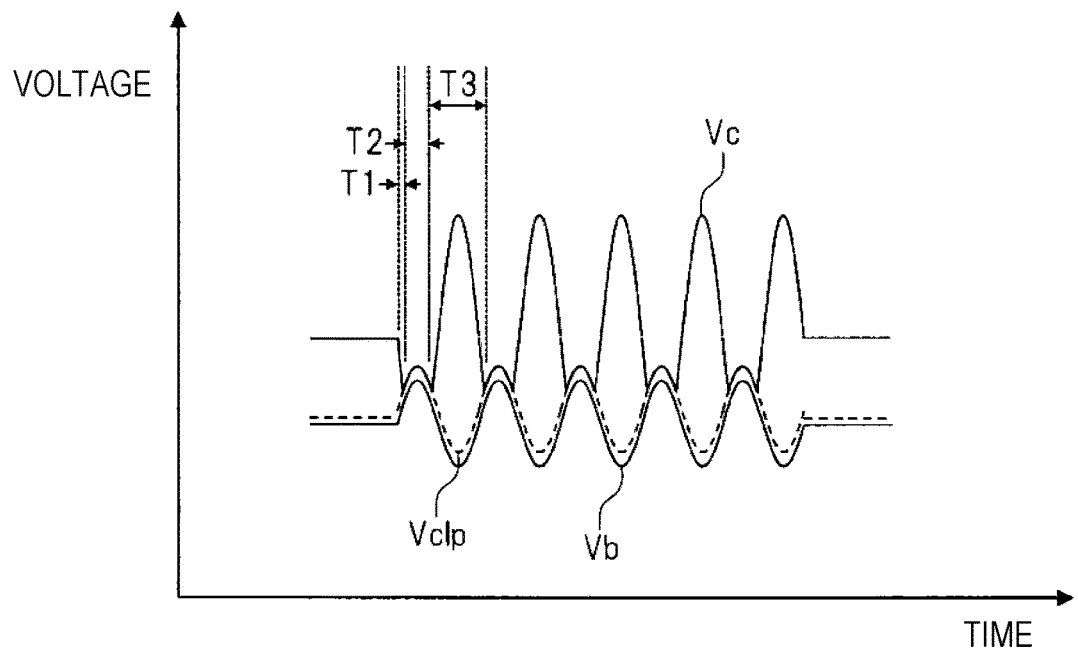
FIG. 4 is a diagram illustrating an example of a waveform in a transient state when an overload is input in the second embodiment of the invention.

FIG. 4 is a diagram illustrating an example of a waveform in a transient state when an overload is input according to the second embodiment of the invention. In FIG. 4, Vc is the collector potential of the NPN transistor 111, Vb is the base potential of the NPN transistor 111, and Vclp is the clamp potential. As illustrated in FIG. 4, in a case where the base potential Vb of the NPN transistor 111 repeatedly rises and falls periodically, the clamp potential Vclp also repeatedly rises and falls in conjunction with the base potential Vb of the NPN transistor 111.

In Period T1, the base potential Vb rises, and the collector potential Vc falls. The collector potential Vc falls from a state higher than the clamp potential Vclp (Vc>Vclp).

When the collector potential Vc reaches the clamp potential Vclp, Period T1 ends. In Period T2, the base potential Vb rises and then falls. On the other hand, the collector potential Vc is clamped at the clamp potential Vclp, rises in conjunction with the base potential Vb, and then falls. In Period T3, the base potential Vb rises after falling. On the other hand, the collector potential Vc rises and then falls and becomes higher than the clamp potential Vclp. In a transient state in a case where the overload input is a sine wave, the NPN transistor 111 of the common emitter amplifier circuit 110 repeats these operations.

Main Effects of this Embodiment

According to this embodiment, the following effects are obtained in addition to the effects of the first embodiment. According to this embodiment, the base potential of the NPN transistor 234 is set higher than the base potential Vb of the NPN transistor 111 by making a constant current flow from the diode 231 and the resistor 232 from the constant current source 233.

In addition, according to this embodiment, NPN transistors are provided in a level shift circuit 231 and the clamp diode 234 of the clamp circuit 230, respectively. According to this configuration, it is possible to offset the variation of the base-emitter potential and the temperature variation between the NPN transistor forming the diode 231 and the NPN transistor 234. In addition, with this configuration, a stable clamp potential Vclp is obtained.

In addition, according to this embodiment, the resistor 232 forming the level shift circuit is provided. According to this configuration, it is possible to easily adjust the clamp potential Vclp.

In addition, according to this embodiment, the diode 235 is provided between the emitter and the base of the NPN transistor 234. According to this configuration, since the reverse voltage between the emitter and the base of the NPN transistor 234 is adjusted to be equal to or lower than a predetermined withstand voltage, the NPN transistor 234 and the clamp circuit 230 can be protected.

In addition, according to this embodiment, the diode of the level shift circuit 131 is configured by a bipolar transistor connected between the base and the collector.

Third Embodiment

Next, a third embodiment will be described. In order to ensure resistance to in-phase noises such as power source noise, to reduce even-order distortion of an output signal, and the like, there is a case where an amplifier circuit needs to have a differential configuration. Therefore, in the following embodiment, an amplifier circuit in which the amplifier circuit body is configured by a differential amplifier will be described.

Figure 5:
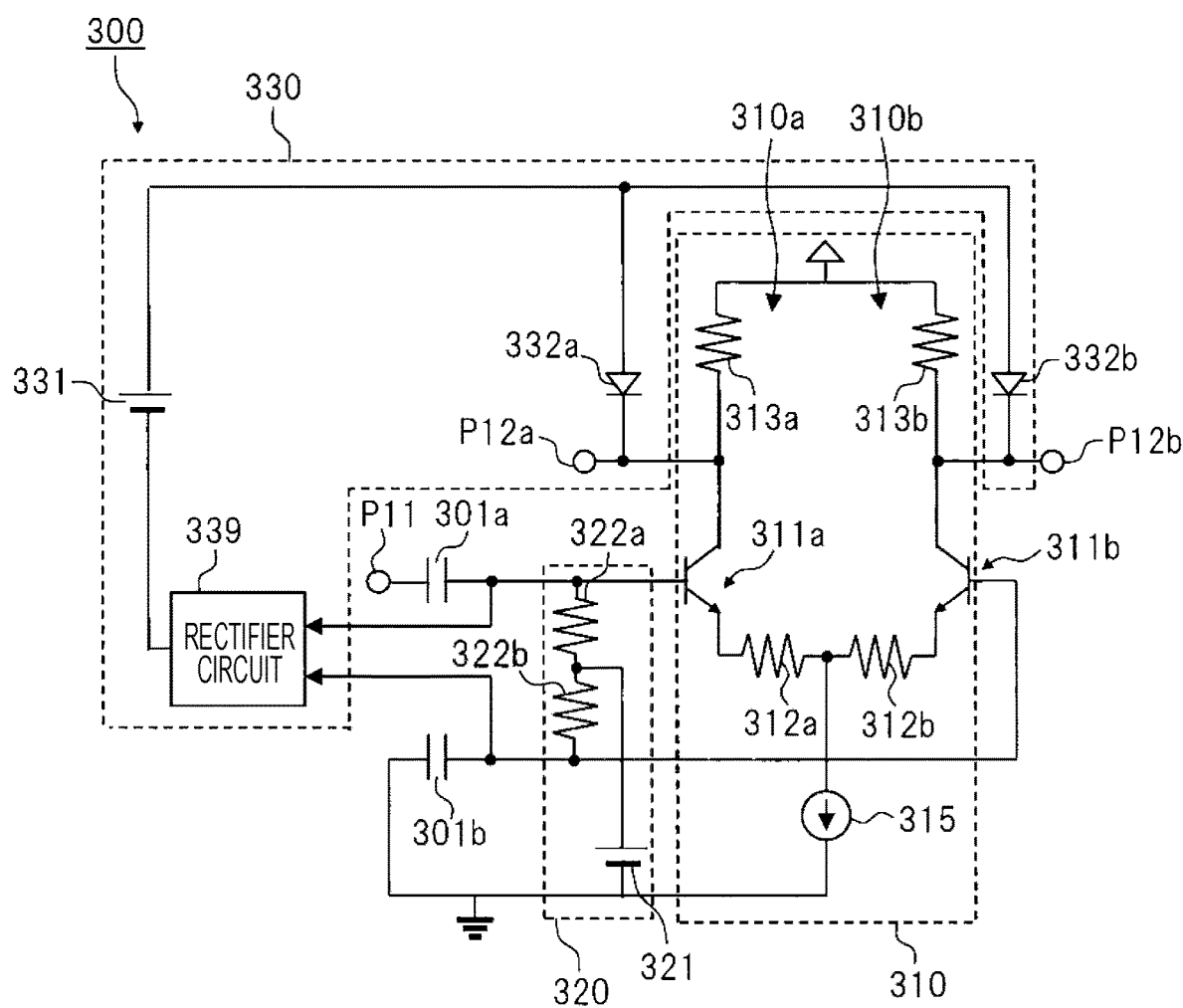
FIG. 5 is a circuit diagram illustrating an example of a configuration of an amplifier circuit according to a third embodiment of the invention.

FIG. 5 is a circuit diagram illustrating an example of a configuration of an amplifier circuit according to the third embodiment of the invention. An amplifier circuit 300 in FIG. 5 includes a differential amplifier (amplifier circuit body) 310, a bias circuit 320, a clamp circuit 330, and the like. As illustrated in FIG. 5, the amplifier circuit 300 has a configuration corresponding to single-ended input and a differential output.

<<Differential Amplifier>>

As illustrated in FIG. 5, the differential amplifier 310 includes a first circuit 310a on the positive side, a second circuit 310b on the negative side, and a constant current source 315. The first circuit 310a and the second circuit 310b form a differential pair. The first circuit 310a includes an NPN transistor 311a on the positive side and resistors 312a and 313a. The emitter of the NPN transistor 311a is connected to the constant current source 315 via the resistor 312a. The collector of the NPN transistor 311a is connected to a high potential power source via the resistor 313a. In addition, the collector of the NPN transistor 311a is connected to an output terminal P12a. A capacitor 301a is provided between the base of the NPN transistor 311a and an input terminal P11.

The second circuit 310b includes an NPN transistor 311b on the negative side and resistors 312b and 313b. The emitter of the NPN transistor 311b is connected to the constant current source 315 via the resistor 312b. The collector of the NPN transistor 311b is connected to a high potential power source via the resistor 313b. In addition, the collector of the NPN transistor 311b is connected to an output terminal P12b. A capacitor 301b is provided between the base of the NPN transistor 311a and the ground.

The emitters of the first circuit 310a and the second circuit 310b are connected to each other via a resistor. As described above, the first circuit 310a and the second circuit 310b form a symmetric differential pair. The current in the differential amplifier 310 is kept constant by the constant current source 315.

<<Bias Circuit>>

The bias circuit 320 is a circuit that biases the base of the NPN transistor 311a and the base of the NPN transistor 311b. As illustrated in FIG. 5, the bias circuit 320 includes a level shift circuit 321, and high-resistance value resistors 322a and 322b.

One end of the resistor 322a is connected to the base of the NPN transistor 311a. One end of the resistor 322b is connected to the base of the NPN transistor 311b. The other end of the resistor 322a is connected to the other end of the resistor 322b. In this way, the resistors 322a and 322b are connected in series between the base of the NPN transistor 311a and the base of the NPN transistor 311b.

The positive side of a constant voltage source circuit 321 is connected to the other end of the resistor 322a and the other end of the resistor 322b. The negative side of the constant voltage source circuit 321 is grounded.

The base of the NPN transistor 311a is AC-connected to the input terminal P11 via the capacitor 301a. In addition, the base of the NPN transistor 311b is grounded to the ground via the capacitor 301b. Therefore, the bias circuit 320 can determine the bias of the base of the NPN transistor 311a and the base of the NPN transistor 311b independently of the sensor at the preceding stage.

<<Clamp Circuit>>

The clamp circuit 330 is provided between the base and the collector of the NPN transistor 311a and between the base and the collector of the NPN transistor 311b. The clamp circuit 330 clamps the collector potential of the NPN transistor 311a and the collector potential of the NPN transistor 311b so that the potentials of the output terminals P12a and P12b do not drop and the NPN transistors 311a and 311b do not enter a saturation state.

As illustrated in FIG. 5, the clamp circuit 330 includes a level shift circuit 331, clamp diodes 332a and 332b, and a rectifier circuit 339. The input terminal of the rectifier circuit 339 is connected to the base of the NPN transistor 311a and the base of the NPN transistor 311b, respectively. The output terminal of the rectifier circuit 339 is connected to the negative side of the level shift circuit 331. The rectifier circuit 339 selects and outputs one of the base potentials of the NPN transistors 311a and 311b.

The positive side of the level shift circuit 331 is connected to the anode of the clamp diode 332a and the anode of the clamp diode 332b, respectively. The cathode of the clamp diode 332a is connected to the collector of the NPN transistor 311a and the output terminal P12a. The cathode of the clamp diode 332b is connected to the collector of the NPN transistor 311b and the output terminal P12b. In this way, in this embodiment, the clamp diodes 332a and 332b corresponding to the pair of the NPN transistors 311a and 311b are provided.

The clamp circuit 330 is a circuit that clamps the collector potential of the NPN transistor 311a and the collector potential of the NPN transistor 311b so that the potentials of the output terminals P12a and P12b do not drop and the NPN transistors 311a and 311b do not enter a saturation state.

<Operation of Amplifier Circuit>

Next, the operation of the amplifier circuit having a differential amplifier will be described. The input terminal P11 is connected to, for example, the sensor in FIG. 21. For this reason, the potential of the base of the NPN transistor 311a fluctuates according to the intensity of the signal input from the sensor.

On the other hand, the base of the NPN transistor 311b forming the differential pair is grounded via the capacitor 301b. Therefore, no signal is input to the base of the NPN transistor 311b, and the base potential of the NPN transistor 311b is a DC potential.

The differential amplifier 310 outputs predetermined potentials from the output terminals P12a and P12b according to the base potential of the NPN transistor 311a and the base potential of the NPN transistor 311b, respectively. In this way, in a case where the amplifier circuit body is configured by a differential amplifier, a predetermined differential output corresponding to the base potential of each transistor is obtained.

The rectifier circuit 339 extracts the higher one of the base potentials of the NPN transistors 311a and 311b forming the differential pair. Then, the clamp circuit 330 generates a clamp potential by shifting the potential with reference to the output potential of the rectifier circuit 339. Then, even if the collector potential of the NPN transistor 311a drops, the clamp diode 332a clamps the collector potential of the NPN transistor 311a. In addition, the clamp diode 332b clamps the collector potential of the NPN transistor 311b even if the collector potential of the NPN transistor 311b drops.

Main Effects of this Embodiment

According to this embodiment, the amplifier circuit body is formed of a differential pair by the first circuits 310a and 310b having a symmetric configuration. According to this configuration, the in-phase noises such as power source noise can be reduced. With this configuration, it is possible to improve resistance to the in-phase noises. In addition, it is possible to reduce even-order distortion of the output signal.

In addition, according to this embodiment, the clamp diodes 332a and 332b respectively corresponding to the pair of the NPN transistors 311a and 311b are provided. According to this configuration, the collector potential can be clamped for each of the NPN transistors 311a and 311b.

Fourth Embodiment

Figure 6:
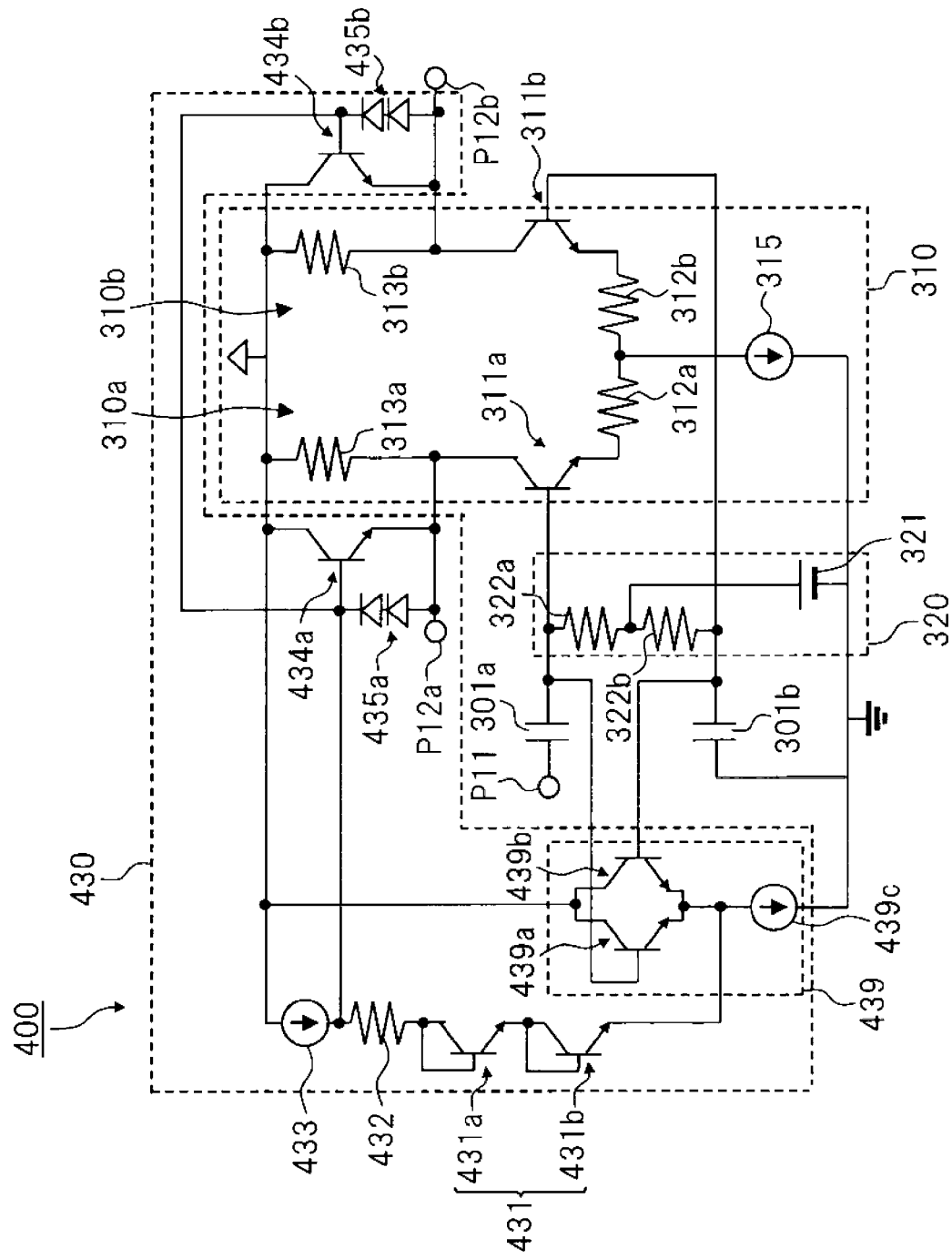
FIG. 6 is a circuit diagram illustrating an example of an amplifier circuit according to the fourth embodiment of the invention.

Next, a fourth embodiment will be described. FIG. 6 is a circuit diagram illustrating an example of the amplifier circuit according to the fourth embodiment of the invention. An amplifier circuit 400 in FIG. 4 includes the differential amplifier (amplifier circuit body) 310, the bias circuit 320, a clamp circuit 430, and the like. The amplifier circuit 400 in FIG. 6 is similar to the amplifier circuit 300 in FIG. 5, and has a configuration corresponding to single-ended input and differential output.

<<Clamp Circuit>>

The clamp circuit 430 of this embodiment includes a diode 431, a resistor 432, a constant current source 433, NPN transistors 434a and 434b as emitter followers, diodes 435a and 435b, and a rectifier circuit 439.

As illustrated in FIG. 6, the rectifier circuit 439 includes NPN transistors 439a and 439b as emitter followers and a constant current source 439c. The base of the NPN transistor 439a is connected to the base of the NPN transistor 311a of the differential amplifier 310. The base of the NPN transistor 439b is connected to the base of the NPN transistor 311b of the differential amplifier 310.

The emitter of the NPN transistor 439a and the emitter of the NPN transistor 439b are connected to the high potential side of the constant current source 439c. In addition, the emitter of the NPN transistor 439a and the emitter of the NPN transistor 439b are connected to the cathode of a diode 431a. The low potential side of the constant current source 439c is grounded.

The collector of the NPN transistor 439a and the collector of the NPN transistor 439b are connected to a high potential power source. As described above, the rectifier circuit 439 of this embodiment is realized by an emitter follower having a common emitter in which the emitters of the NPN transistors 439a and 439b are connected to each other. In this way, the rectifier circuit 439 includes a pair of emitter follower bipolar transistors 439a and 439b corresponding to the pair of bipolar transistors 311a and 311b, respectively.

The diode 431 includes the diodes 431a and 431b, and has a configuration in which the diodes 431b and 431a are sequentially connected in series from the high potential side. The diodes 431a and 431b have the same configuration as the diode 231 in FIG. 2, and have a configuration in which the base and the collector of the NPN transistor are connected. Therefore, the base and the collector of the NPN transistor correspond to the anodes of the diodes 431a and 431b, and the emitter of the NPN transistor corresponds to the cathodes of the diodes 431a and 431b.

The cathode of the diode 431a is connected to the emitter of the NPN transistor 439a and the emitter of the NPN transistor 439b. The anode of the diode 431a is connected to the cathode of the diode 431b. The anode of the diode 431b is connected to one end of the resistor 432.

The other end of the resistor 432 is connected to the low potential side of the constant current source 433, the base of the NPN transistor 434a, and the base of the NPN transistor 434b. The high potential side of the constant current source 433 is connected to a high potential power source. The constant current source 433 supplies a current to the resistor 432, the base of the NPN transistor 434a, and the base of the NPN transistor 434b during the clamp operation. In this embodiment, the diodes 431a and 431b, the resistor 432, and the constant current source 433 implement the level shift circuit 331 in FIG. 5.

The collector of the NPN transistor 434a is connected to a high potential power source. The emitter of the NPN transistor 434a is connected to the collector of the NPN transistor 311a and the output terminal P12a. The NPN transistor 434a of the emitter follower clamps the collector potential of the NPN transistor 311a (the output potential of the output terminal P12a). In other words, in this embodiment, the clamp diode 332a in FIG. 3 is realized by the NPN transistor 434a of the emitter follower.

The diode 435a is provided between the emitter and the base of the NPN transistor 434a. The diode 435a has a configuration in which a plurality of diodes are connected in series. Further, the diode 435a may be configured by one diode, or may be configured by three or more diodes.

The collector of the NPN transistor 434b is connected to a high potential power source. The emitter of the NPN transistor 434b is connected to the collector of the NPN transistor 311b and the output terminal P12b. The NPN transistor 434b of the emitter follower clamps the collector potential of the NPN transistor 311b (the output potential of the output terminal P12b). In other words, in this embodiment, the clamp diode 332b in FIG. 3 is realized by the NPN transistor 434b of the emitter follower.

The diode 435b is provided between the emitter and the base of the NPN transistor 434b. The diode 435b has a configuration in which a plurality of diodes are connected in series. Further, the diode 435b may be configured by one diode, or may be configured by three or more diodes.

The diodes 435a and 435b are clamp diodes that set the reverse voltage between the emitter and the base of the NPN transistors 434a and 434b to be predetermined withstand voltage or less in a case where the potential of the input terminal P11 and the base potentials of the NPN transistors 311a and 311b decrease and the potentials of the output terminals P12a and P12b increase. In this way, the diodes 435a and 435b protect the NPN transistors 434a and 434b, respectively, and protect the clamp circuit 230.

Specifically, when the potential of the input terminal P11 and the base potential of the NPN transistor 111 decrease, the voltage applied to both ends of the diode 435a increases on the emitter side of the NPN transistor 434a. Then, a forward current flows through the diode 435a from the emitter to the base of the NPN transistor 434a. With this configuration, the emitter potential of the NPN transistor 434a is lowered via the diode 435a, and the reverse voltage between the emitter and the base of the NPN transistor 434a is adjusted to a predetermined breakdown voltage or less. In this way, the diode 435a clamps the emitter-base potential of the NPN transistor 434a. The diode 435b operates similarly to the diode 435a, and clamps the emitter-base potential of the NPN transistor 434b.

<Operation of Amplifier Circuit>

Figure 7:
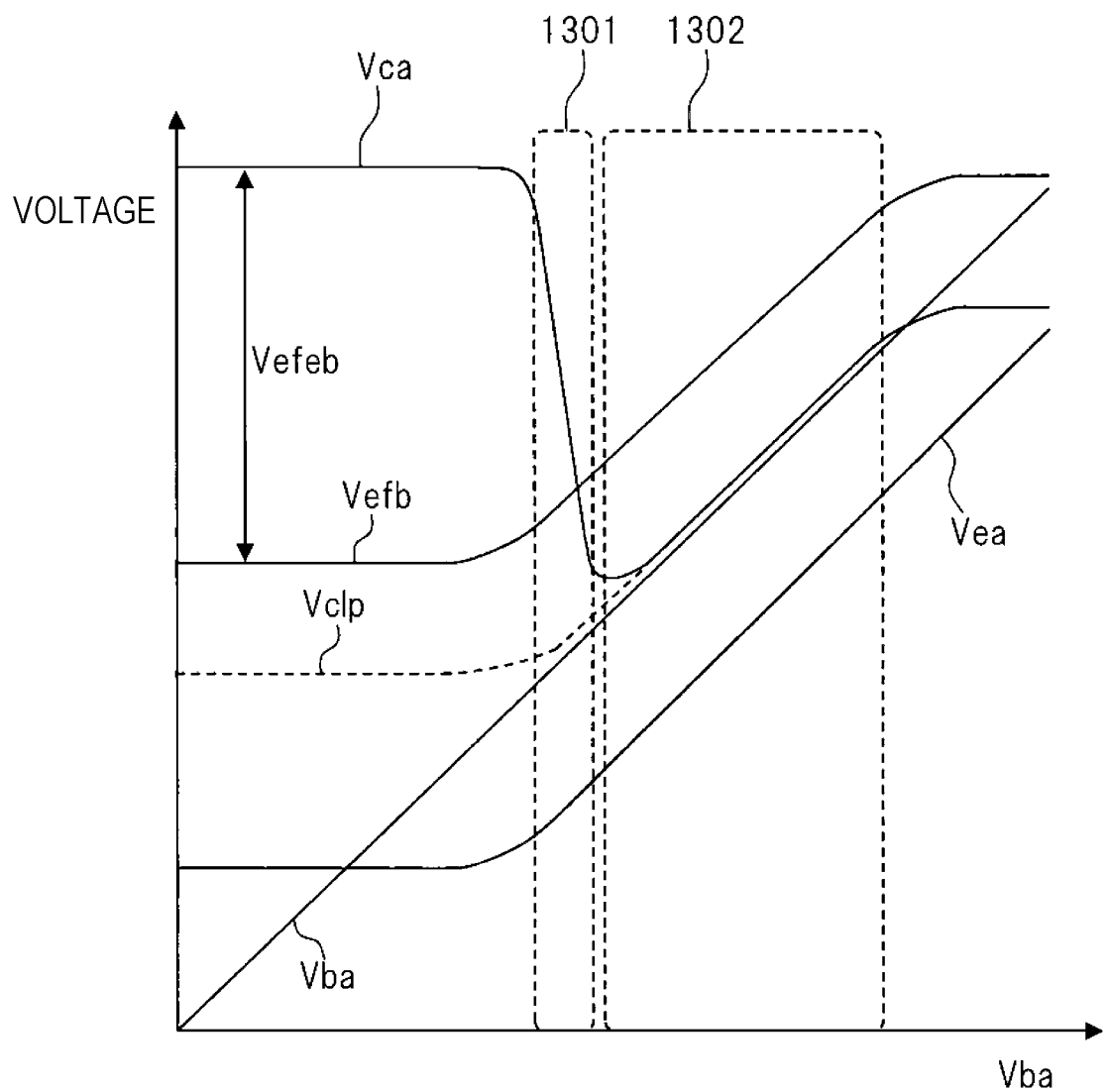
FIG. 7 is a diagram illustrating an example of DC characteristics of the amplifier circuit according to the fourth embodiment of the invention.

FIG. 7 is a diagram illustrating an example of DC characteristics of the amplifier circuit according to the fourth embodiment of the invention. FIG. 7 mainly illustrates the DC characteristics of the first circuit 310a of the differential amplifier 310. Vca of FIG. 7 is the collector potential of the NPN transistor 311a of the differential amplifier 310, Vba is the base potential of the NPN transistor 311a, and Vea is the emitter potential of the NPN transistor 311a. Vefb in FIG. 7 is a base potential of the NPN transistors 434a and 434b. Vclp is a virtual clamp potential.

Vefb is obtained by shifting to a high potential from the output potential of the rectifier circuit 439 by a potential obtained by adding the base-emitter potential Vbe of each of the diodes 431a and 431b and the potential calculated by the product of the resistance value of the resistor 432 and the current value supplied from the constant current source 433.

More specifically, Vefb is a potential obtained by shirting from the higher base potential of the NPN transistors 311a and 311b of the differential amplifier 310 by the base-emitter potential Vbe of any one of the NPN transistors 439a and 439b of the rectifier circuit 439, by the base-emitter potential Vbe of each of the diodes 431a and 431b, and by the potential calculated by the product of the resistance value of the resistor 432 and the current value supplied from the constant current source 433.

Then, the clamp potential Vclp is lower than Vefb by the base-emitter potential Vbe of the NPN transistor 434a. With the clamp circuit 230, the collector potential Vca of the NPN transistor 311a does not drop below the clamp potential Vclp.

In addition, as described above, Vefb is lower than the base potential of the NPN transistor of the differential amplifier 310 by the base-emitter potential of the NPN transistor included in the rectifier circuit 439, and higher by the base-emitter potential of two NPN transistors included in the diode 431. On the other hand, the clamp potential Vclp is a potential lower than Vefb by the base-emitter potential Vbe of the NPN transistor 434a. Therefore, at the clamp potential Vclp, the base-emitter Vbe of the above-mentioned NPN transistor is all offset. Therefore, the clamp potential Vclp is determined by the sum of the base potential of one of the NPN transistors included in the differential amplifier 310 and the product of the resistor 432 and the current supplied from the constant current source 433.

Therefore, since the clamp current Vclp is not affected by the NPN transistor provided on the path, it is possible to set the clamp potential Vclp excellent in stability against temperature fluctuation and variation.

Comparing FIGS. 7 and 3, the operation of the NPN transistor 311a in the region where the base potential is low is different from FIG. 3. On the other hand, operations in a linear range 1301 and a high base range 1302 are almost the same as those in FIG. 3. In other words, even in a case where the differential amplifier 310 is used as the amplifier circuit body, the state of Vca>Vba is maintained over a wide range including the linear range 1301 and the high base range 1302 when an overload is input.

<<Reasons why Rectifier Circuit is Required>>

In an amplifier circuit including a differential amplifier, a rectifier circuit is provided in a clamp circuit. Herein, the reason why a rectifier circuit is required will be described. Further, in the following, the reason why a rectifier circuit is required according to the configuration of the fourth embodiment will be described.

The rectifier circuit 439 selects a higher one of the base potential of the NPN transistor 311a on the positive side and the base potential of the NPN transistor 431b on the negative side that form a differential amplifier 410, and outputs a potential lowered from the selected base potential by the base-emitter potential of the NPN transistor.

As described above, the base of the NPN transistor 431b on the negative side of a differential amplifier 310a is at the DC potential. Therefore, in a case where the base potential of the NPN transistor 431a on the positive side decreases due to an overload, the clamp potential is determined on the basis of the base potential of the NPN transistor 431b on the negative side. Therefore, in a region where the base potential Vba of the NPN transistor 431a on the positive side is low, as illustrated in FIG. 7, Vefb and Vclp do not follow Vba, but are lowered and stopped by a predetermined potential defined based on the base potential of the NPN transistor 431b on the negative side.

Figure 8:
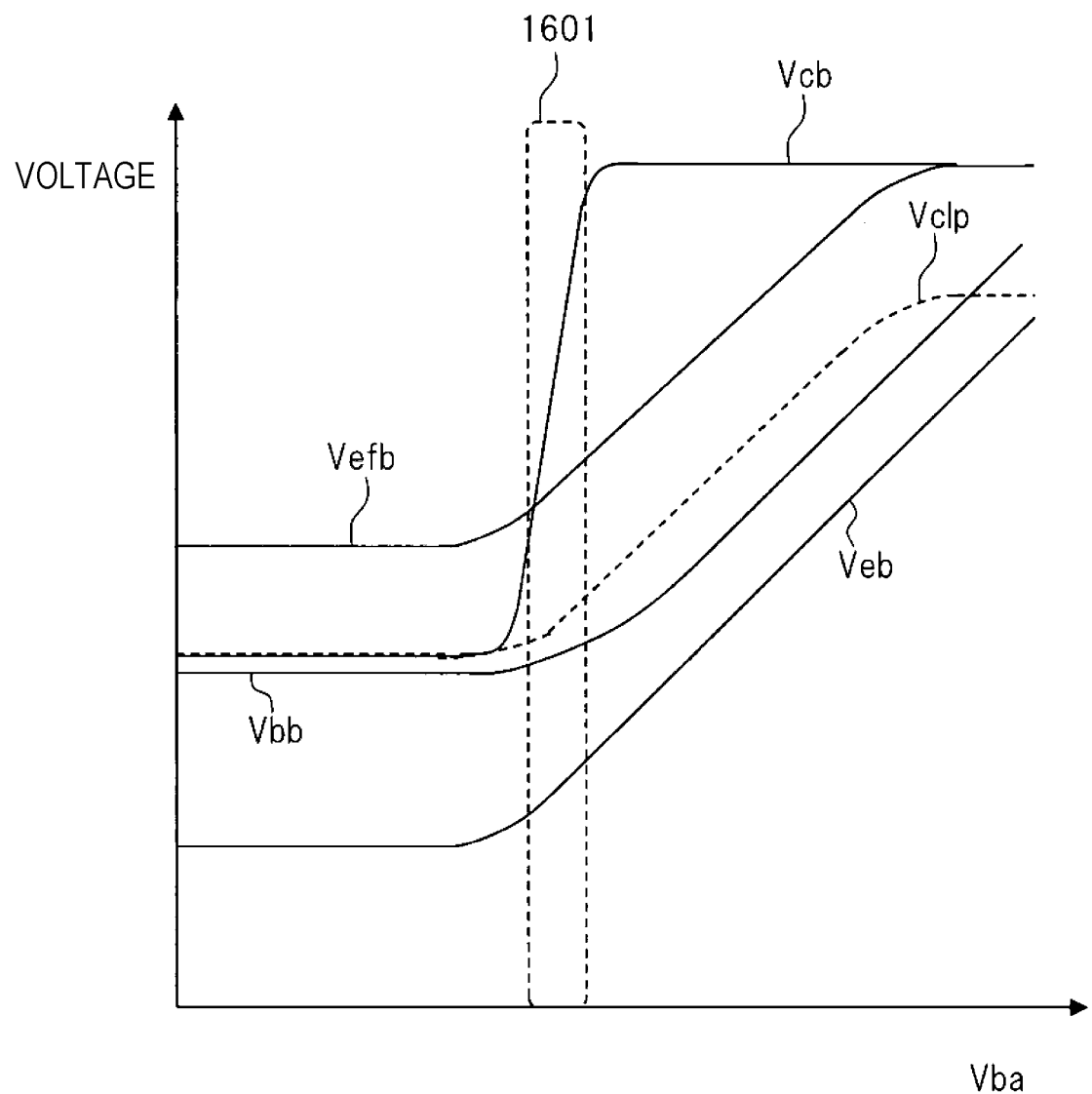
FIG. 8 is a diagram for describing a reason why a rectifier circuit is required.
Figure 9:
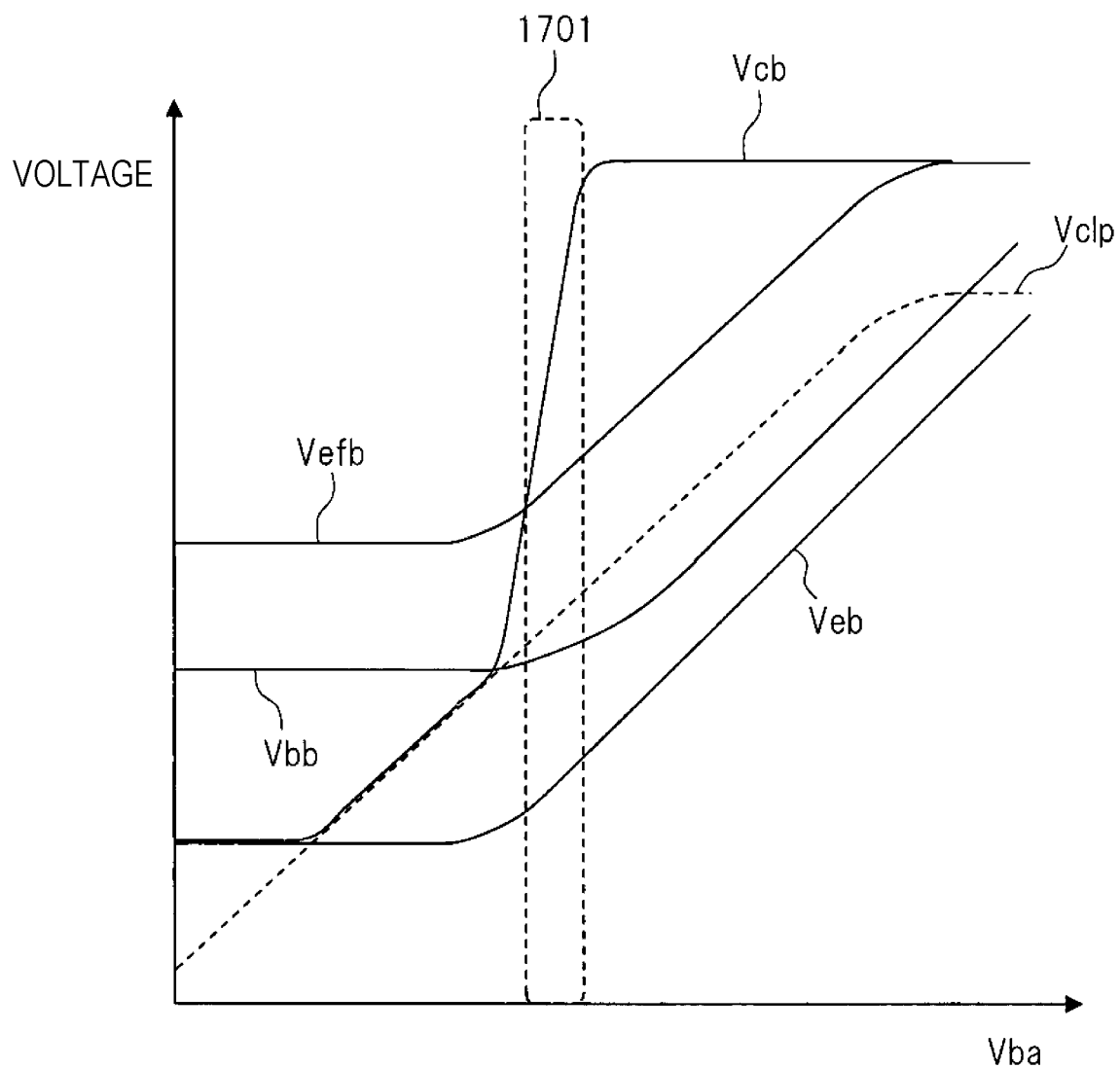
FIG. 9 is a diagram for describing a reason why the rectifier circuit is required.

FIGS. 8 and 9 are diagrams for describing the reason why a rectifier circuit is required. FIG. 8 mainly illustrates DC characteristics of the second circuit 310b of the differential amplifier 310. The horizontal axis in FIG. 8 is the base potential Vba of the NPN transistor 311a on the positive side, which is a signal input. Vcb of FIG. 8 is the collector potential of the NPN transistor 311b on the negative side of the differential amplifier 310, Vbb is the base potential of the NPN transistor 311b, and Veb is the emitter potential of the NPN transistor 311b.

The input signal from the sensor is not supplied to the base of the NPN transistor 311b. In addition, the base of the negative side NPN transistor 311b has high impedance. Therefore, when the base potential Vba of the NPN transistor 311a on the positive side increases, the emitter potential Veb of the NPN transistor 311b on the negative side rises following the emitter potential of the NPN transistor 311a of which the potential is lowered from Vba by the base-emitter potential of the NPN transistor 311a. Then, the base potential Vbb of the NPN transistor 311b also rises following the rise of the emitter potential Veb of the NPN transistor 311b.

On the other hand, in a region where Vba is low, the base potential Vbb of the NPN transistor 311b becomes a constant potential defined by the bias circuit 320. Then, the rectifier circuit 439 outputs a potential lower than the constant base potential Vbb by the base-emitter potential of the NPN transistor 439b. Therefore, in a region where Vba is lower than a linear region 1601, the clamp potential Vclp is lowered and stopped at a predetermined potential that does not depend on Vba. Therefore, the collector potential Vcb of the NPN transistor 311b does not drop below the clamp potential Vclp, and the state of Vcb>Vbb is maintained even in a region where Vba is low.

FIG. 9 is a diagram illustrating the DV characteristics of the negative side transistor in a case where a rectifier circuit is not provided in the clamp circuit. Note that the symbols in FIG. 9 are the same as those in FIG. 8. If the rectifier circuit 439 is not provided in the clamp circuit 430, the clamp potential Vclp follows only Vba. In addition, even in a region where Vba is lower than a linear region 1701, the clamp potential Vclp drops following only Vba, and the collector potential Vcb of the NPN transistor on the negative side also drops to Vclp. Then, in a region where Vba is lower than the linear region 1701, the state of Vcb<Vb occurs. The state of Vcb>Vbb cannot be maintained. Thus, a rectifier circuit is required in an amplifier circuit including a differential amplifier.

In addition, when a rectifier circuit is mounted, the withstand voltage of the transistor can be reduced. The emitter-base voltage of the NPN transistor 434a of the emitter follower is set to Vefeb. In a region where the base potential Vba of the NPN transistor 434a is lower than a linear region 1301, Vefeb is substantially constant as illustrated in FIG. 7.

In general, the reverse breakdown voltage (Vb<Ve) between the emitter and the base in the NPN transistor depends on the semiconductor process. However, it is necessary to design such that a withstand voltage violation does not occur even when an overload is input. Therefore, if the rectifier circuit 439 is introduced into the clamp circuit 430, it is possible to secure a margin against the withstand voltage violation of the NPN transistors 434a and 434b.

The same effect can be obtained even by the emitter and the base clamp diodes 435a and 435b provided in the NPN transistors 434a and 434b of the emitter follower. However, in the clamp diodes 435a and 435b, there is a restriction that the clamp voltage can be specified only by a value that is a natural number multiple of the diode forward voltage. On the other hand, if the rectifier circuit 439, the diode 431, the resistor 432, and the constant current source 433 are used, there is an advantage that Vefb and Vefeb can be set arbitrarily.

In addition, the rectifier circuit 439 is connected to both the bases of the NPN transistor 331a and 331b of the differential pair, so that the effects of improving the power source noise removal performance and reducing the even-order distortion are obtained while ensuring the symmetry of the differential amplifier.

<<Change of Clamp Potential in Transient State>>

Figure 10:
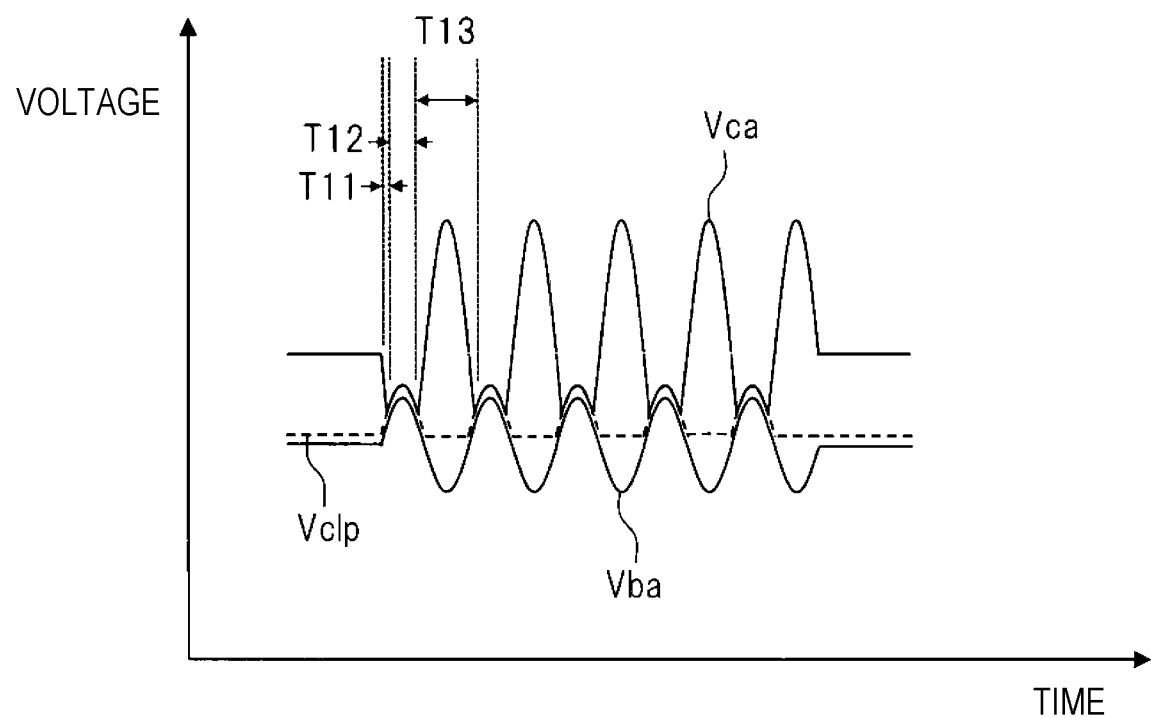
FIG. 10 is a diagram illustrating an example of a waveform in a transient state when an overload is input in the fourth embodiment of the invention.
Figure 11:
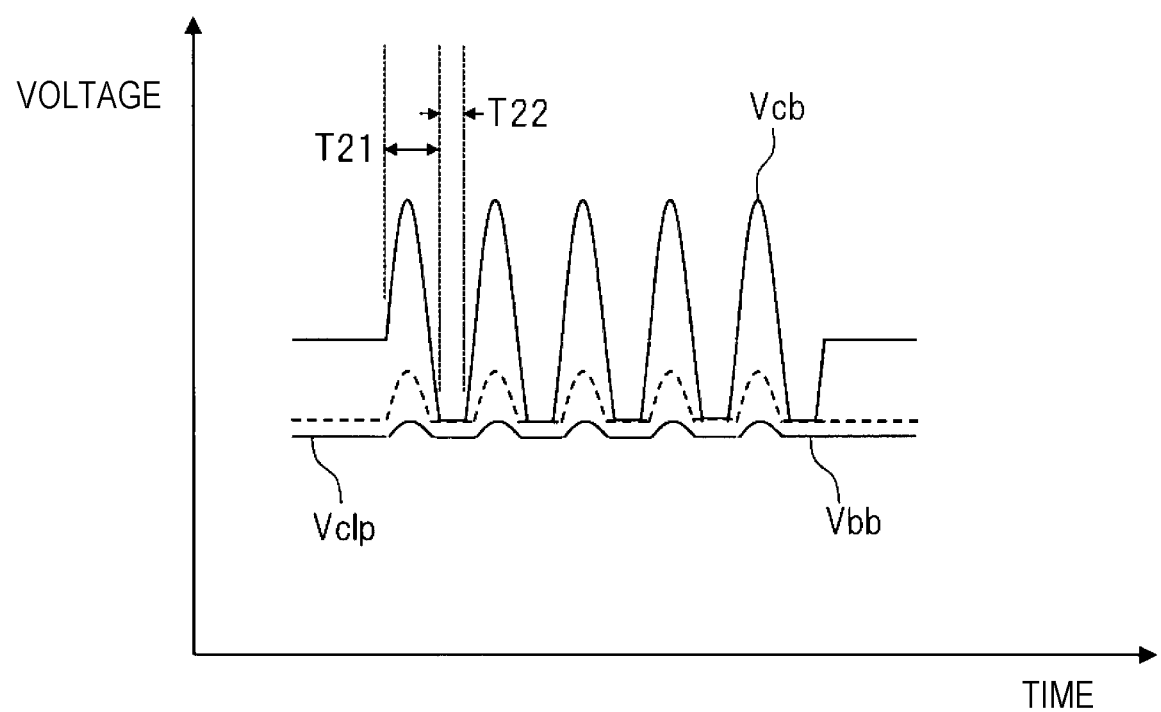
FIG. 11 is a diagram illustrating an example of a waveform in a transient state when an overload is input in the fourth embodiment of the invention.

Next, the fluctuation of the clamp potential in a transient state will be described. FIGS. 10 and 11 are diagrams illustrating an example of a waveform in a transient state when an overload is input according to the fourth embodiment of the invention. FIG. 10 illustrates a waveform of a transient state in the NPN transistor 311a on the positive side of the differential amplifier 310.

Vca of FIG. 10 is the collector potential of the NPN transistor 311a on the positive side, Vba is the base potential of the NPN transistor 311a, and Vclp is the clamp potential. As illustrated in FIG. 10, the operation of the NPN transistor 311a is similar to FIG. 4. However, the waveform of the clamp potential Vclp is different from FIG. 4.

The waveform of the clamp potential Vclp in Periods T11 and T12 is the same as the waveform in each of Periods T1 and T2 in FIG. 4. On the other hand, in Period T13, the base potential Vba of the NPN transistor 311a is lower than the base potential of the NPN transistor 311b.

In this case, clamp potential Cvlp does not follow the low-potential base potential Vba, but is defined by the high-potential NPN transistor 311b. Therefore, the clamp potential Cvlp in Period T13 is substantially constant. In a transient state when an overload is input, the NPN transistor 311a of the differential amplifier 310 repeats these operations. In this way, the state of Vca>Vba is maintained in the NPN transistor 311a.

On the other hand, FIG. 11 illustrates a waveform in a transient state of the NPN transistor 311b on the negative side of the differential amplifier 310.

In Period T21, the base potential of the NPN transistor 311a is higher than that of the NPN transistor 311b. The collector potential Vcb of the NPN transistor 311b rises greatly and then falls. In addition, due to this influence, the base potential Vbb of the NPN transistor 311b slightly rises from a predetermined potential and then falls. The clamp potential Vclp in Period T21 is defined based on the base potential of the NPN transistor 311a, and rises and falls following the base potential of the NPN transistor 311a.

With this regard, in Period T22, the base potential of the NPN transistor 311b is higher than that of the NPN transistor 311a. Therefore, the clamp potential Vclp in Period T22 is defined based on the base potential of the NPN transistor 311b. Since the base potential of the NPN transistor 311b is substantially constant, the clamp potential Vclp in Period T22 is also substantially constant. In the latter half of Period T21, the collector potential Vcb of the NPN transistor 311b drops sharply. However, in Period T22, the collector potential Vcb of the NPN transistor 311b is clamped by the clamp potential Vclp, and does not drop below the clamp potential Vclp. In this way, the state of Vcb>Vbb is maintained also in the NPN transistor 311b.

Main Effects of this Embodiment

According to this embodiment, the rectifier circuit 439 has a pair of emitter follower bipolar transistors 439a and 439b corresponding to the pair of bipolar transistors 311a and 311b, respectively. According to this configuration, it is possible to appropriately select the respective base potentials of the bipolar transistors 311a and 311b. In addition, according to this configuration, since the bipolar transistors 439a and 439b are connected in parallel, it is possible to make the amount of potential shift in the rectifier circuit 493 the same regardless of which base potential is selected.

Although an NPN transistor has been described as an example of a bipolar transistor, a PNP transistor can of course be used. In a case where a PNP transistor is used, the potential relation between the base and the collector and the potential relation between the base and the emitter are opposite to those when the NPN transistor is used.

Further, the invention is not limited to the above embodiments, but various modifications may be contained. In addition, some of the configurations of a certain embodiment may be replaced with the configurations of the other embodiments, and the configurations of the other embodiments may be added to the configurations of a certain embodiment. In addition, some of the configurations of each embodiment may be omitted, replaced with other configurations, and added to other configurations. Further, each member and relative size described in the drawings are simplified and idealized for easy understanding of the invention, and may have a more complicated shape in mounting.

What is claimed is:

1. Amplifier circuit, comprising:
an amplifier circuit body which includes a bipolar transistor; and
a clamp circuit which maintains a potential relation between a base and a collector of the bipolar transistor of the amplifier circuit body,
wherein the clamp circuit includes a level shift circuit and a clamp diode which suppresses a decrease in a collector potential of the bipolar transistor of the amplifier circuit body, and
wherein the level shift circuit has a configuration in which a diode, a resistor, and a constant current source are connected in series.

2. The amplifier circuit according to claim 1,
wherein the diode of the level shift circuit is configured by a bipolar transistor having a base-collector connection.

3. Amplifier circuit, comprising:
an amplifier circuit body which includes a bipolar transistor; and
a clamp circuit which maintains a potential relation between a base and a collector of the bipolar transistor of the amplifier circuit body,
wherein the clamp circuit includes a level shift circuit and a clamp diode which suppresses a decrease in a collector potential of the bipolar transistor of the amplifier circuit body, and
wherein the clamp diode is configured by a bipolar transistor of an emitter follower.

4. The amplifier circuit according to claim 1,
wherein the clamp diode includes a diode for clamping a base-emitter voltage of the bipolar transistor within a reverse breakdown voltage.

5. The amplifier circuit according to claim 1,
wherein the amplifier circuit body is a common emitter amplifier circuit.

6. Amplifier circuit, comprising:
an amplifier circuit body which includes a bipolar transistor; and
a clamp circuit which maintains a potential relation between a base and a collector of the bipolar transistor of the amplifier circuit body,
wherein the clamp circuit includes a level shift circuit and a clamp diode which suppresses a decrease in a collector potential of the bipolar transistor of the amplifier circuit body,
wherein the amplifier circuit body is a differential amplifier having a differential pair,
wherein the clamp circuit includes a clamp diode corresponding to each of a pair of bipolar transistors included in the differential pair,
wherein the clamp circuit includes a rectifier circuit provided between each of bases of the pair of bipolar transistors and the level shift circuit, and
wherein the rectifier circuit selects and outputs one of base potentials of the respective bases.

7. The amplifier circuit according to claim 6,
the rectifier circuit includes a pair of bipolar transistors of an emitter follower respectively corresponding to the pair of bipolar transistors, and
wherein the pair of bipolar transistors of an emitter follower are connected in parallel.

8. Amplifier circuit, comprising:
an amplifier circuit body which includes a bipolar transistor; and
a clamp circuit which maintains a potential relation between a base and a collector of the bipolar transistor of the amplifier circuit body,
wherein the clamp circuit includes a level shift circuit and a clamp diode which suppresses a decrease in a collector potential of the bipolar transistor of the amplifier circuit body,
wherein the amplifier circuit body is a differential amplifier having a differential pair,
wherein the clamp circuit includes a clamp diode corresponding to each of a pair of bipolar transistors included in the differential pair,
wherein the bipolar transistors included in the differential pair are NPN transistors, and
wherein the rectifier circuit selects and outputs a higher one of the base potentials.

* * * * *